US012772617B2

(12) United States Patent
Zhang et al.

(10) Patent No.: US 12,772,617 B2
(45) Date of Patent: Oct. 20, 2026

(54) COMPOSITE SUBSTRATE, EPITAXIAL WAFER, AND SEMICONDUCTOR DEVICE

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 464 days.

(21) Appl. No.: 18/347,036

(22) Filed: Jul. 5, 2023

(65) Prior Publication Data

US 2024/0186450 A1 Jun. 6, 2024

(30) Foreign Application Priority Data

Dec. 6, 2022 (CN) ......................... 202223267004.5

(51) Int. Cl.

| | |
|---|---|
| ***H01L 33/32*** | (2010.01) |
| ***H10D 30/47*** | (2025.01) |
| ***H10D 62/85*** | (2025.01) |
| ***H10H 20/812*** | (2025.01) |
| ***H10H 20/825*** | (2025.01) |

(52) U.S. Cl.

CPC ........ *H10H 20/825* (2025.01); *H10D 30/475* (2025.01); *H10D 62/8503* (2025.01); *H10H 20/812* (2025.01)

(58) Field of Classification Search

CPC ............... H10H 20/825; H10H 20/812; H10H 20/01335; H10H 20/81; H10D 30/475; H10D 62/8503; Y02P 70/50

See application file for complete search history.

(56) References Cited

U.S. PATENT DOCUMENTS

| | | | | |
|---|---|---|---|---|
| 7,612,361 B2 * | 11/2009 | Park | H01L 21/02458 | 257/190 |
| 8,008,682 B2 * | 8/2011 | Liaw | H10W 70/692 | 257/E33.058 |
| 8,236,667 B2 * | 8/2012 | Ito | H10D 86/01 | 438/695 |
| 8,357,586 B2 * | 1/2013 | Akiyama | H01L 21/30608 | 438/455 |
| 8,501,563 B2 * | 8/2013 | Sandhu | H10D 64/035 | 438/257 |
| 8,802,539 B2 * | 8/2014 | Allibert | H10D 64/037 | 257/506 |
| 8,822,306 B2 * | 9/2014 | Berger | H01L 21/76251 | 438/455 |
| 9,198,294 B2 * | 11/2015 | Landru | H05K 1/18 | |

(Continued)

*Primary Examiner* — Jay C Kim

(74) *Attorney, Agent, or Firm* — Westbridge IP LLC

(57) ABSTRACT

Disclosed are a composite substrate, an epitaxial wafer, and a semiconductor device. The composite substrate includes: a support substrate layer; a first alumina layer disposed on the support substrate layer; and a sapphire substrate layer disposed on the first alumina layer. The first alumina layer may increase a bonding force between the sapphire substrate layer and the support substrate layer and release a stress between the sapphire substrate layer and the support substrate layer. Meanwhile, the existence of the first alumina layer may improve a breakdown voltage of a material without increasing a thickness of the sapphire substrate layer.

15 Claims, 2 Drawing Sheets

(56) References Cited

U.S. PATENT DOCUMENTS

| | | | | |
|---|---|---|---|---|
| 9,305,827 | B2 * | 4/2016 | Ide | C04B 35/115 |
| 9,478,698 | B2 * | 10/2016 | Yang | H10H 20/81 |
| 9,847,401 | B2 * | 12/2017 | Chiu | H10D 30/015 |
| 10,030,318 | B2 * | 7/2018 | Kuraoka | H01L 21/02381 |
| 11,646,242 | B2 * | 5/2023 | Costa | H01L 24/32<br>257/796 |
| 2006/0076559 | A1 * | 4/2006 | Faure | C30B 33/00<br>257/617 |
| 2010/0148322 | A1 * | 6/2010 | Allibert | H01L 21/76251<br>257/E29.007 |
| 2010/0252103 | A1 * | 10/2010 | Yao | H10F 10/142<br>257/E31.119 |
| 2018/0182916 | A1 * | 6/2018 | Saito | H10H 20/0137 |
| 2023/0386891 | A1 * | 11/2023 | Fournel | H01L 21/76251 |
| 2023/0391055 | A1 * | 12/2023 | Akiyama | H01L 21/2007 |
| 2024/0363342 | A1 * | 10/2024 | Cheng | H10D 62/8503 |

* cited by examiner

COMPOSITE SUBSTRATE, EPITAXIAL WAFER, AND SEMICONDUCTOR DEVICE

CROSS-REFERENCE TO RELATED APPLICATIONS

The present application claims priority to Chinese Patent Application No. 202223267004.5, filed on Dec. 6, 2022, which is hereby incorporated by reference in its entirety.

TECHNICAL FIELD

The present disclosure relates to the field of semiconductor technologies, and in particular, to a composite substrate, an epitaxial wafer, and a semiconductor device.

BACKGROUND

Currently, a Metal-Organic Chemical Vapor Deposition (MOCVD) method is commonly used in a preparation of commercial large-scale gallium nitride epitaxial wafers. A substrate material used for epitaxial growth of GaN through the MOCVD method should be a GaN-based material as much as possible, so that a lattice mismatch is small and a thermal expansion coefficient is low. However, since the GaN-based material has an extremely high melting point and a high nitrogen saturation vapor pressure, it is difficult to obtain a GaN substrate with large-area and high-quality. Due to the lack of a substrate that matches a GaN lattice, an epitaxial growth of a current GaN epitaxial wafer is generally performed by using a heterogeneous substrate with lattice mismatch and thermal expansion coefficient mismatch, and the most commonly used heterogeneous substrates are sapphire substrates and silicon substrates. However, both of these two materials have large lattice mismatch and thermal expansion coefficient mismatch with GaN epitaxial layers, so that a high-quality GaN epitaxial structure cannot be grown directly. A GaN epitaxial layer grown on the silicon substrate has poor optical performance, and a tensile stress of a GaN epitaxial layer grown on the sapphire substrate is large.

SUMMARY

In view of this, embodiments of the present disclosure provide a composite substrate, an epitaxial wafer, and a semiconductor device, to solve the technical problem of lattice mismatch and thermal expansion coefficient mismatch between a GaN epitaxial wafer and a heterogeneous substrate in a related art.

According to an aspect of the present disclosure, a composite substrate is provided by an embodiment of the present disclosure, and the composite substrate includes:

a support substrate layer;

a first alumina layer disposed on the support substrate layer; and a sapphire substrate layer disposed on the first alumina layer.

As an optional embodiment, the composite substrate further includes:

a second alumina layer disposed on a side, away from the first alumina layer, of the support substrate layer.

As an optional embodiment, the first alumina layer and the second alumina layer are amorphous alumina.

As an optional embodiment, a thickness of the first alumina layer and a thickness of the second alumina layer are the same.

As an optional embodiment, the support substrate layer is a silicon substrate or a ceramic substrate.

As an optional embodiment, the ceramic substrate is one of an aluminum nitride ceramic substrate, an alumina ceramic substrate, a silicon carbide ceramic substrate, a boron nitride ceramic substrate, a zirconia ceramic substrate, a magnesium oxide ceramic substrate, a silicon nitride ceramic substrate and a beryllium oxide ceramic substrate.

As an optional embodiment, a total thickness of the sapphire substrate layer and the first alumina layer is greater than 1 μm.

As an optional embodiment, a thickness of the sapphire substrate layer is less than 500 nm.

As an optional embodiment, the sapphire substrate layer is a planar sapphire substrate or a patterned sapphire substrate.

According to another aspect of the present disclosure, an epitaxial wafer is provided, and the epitaxial wafer includes:

the above-mentioned composite substrate and an epitaxial layer grown on the composite substrate, where the epitaxial layer includes a gallium nitride layer.

According to another aspect of the present disclosure, a semiconductor device is provided, and the semiconductor device includes:

the above-mentioned epitaxial wafer, where the semiconductor device is any one of a high-electron-mobility transistor device, a vertical power device, a radio frequency device and a light-emitting diode device.

FIG. **6*a*** is a structural schematic diagram of a semiconductor device according to an embodiment of the present disclosure.

FIG. **6*b*** is a structural schematic diagram of a semiconductor device according to another embodiment of the present disclosure.

DETAILED DESCRIPTION OF THE EMBODIMENTS

Technical solutions in embodiments of the present disclosure are described clearly and completely below with reference to the drawings of the embodiments of the present disclosure. Apparently, the described embodiments are only a part, but not all of the embodiments of the present disclosure. All other embodiments that may be obtained by those of ordinary skill in the art based on the embodiments in the present disclosure without any inventive efforts fall into the protection scope of the present disclosure.

Figure 1:
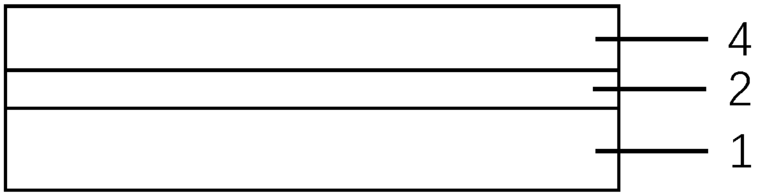
FIG. 1 is a structural schematic diagram of a composite substrate according to an embodiment of the present disclosure.

FIG. 1 is a structural schematic diagram of a composite substrate according to an embodiment of the present disclosure. Referring to FIG. 1, a semiconductor structure is provided in this embodiment, and the semiconductor structure includes a support substrate layer 1, a first alumina layer 2 and a sapphire substrate layer 4 that are stacked in sequence.

In this embodiment, the support substrate layer 1 is a silicon substrate or a ceramic substrate, and the ceramic substrate is one of an aluminum nitride ceramic substrate, an alumina ceramic substrate, a silicon carbide ceramic substrate, a boron nitride ceramic substrate, a zirconia ceramic substrate, a magnesium oxide ceramic substrate, a silicon nitride ceramic substrate and a beryllium oxide ceramic substrate. A diameter of the support substrate layer 1 is greater than or equal to 2 inches and less than or equal to 12 inches.

In one embodiment, the support substrate layer 1 is a ceramic substrate. A thermal mismatch between a sapphire substrate and the ceramic substrate is less than that between the sapphire substrate and the silicon substrate. Therefore, a thermal stress of the sapphire substrate layer 4 may be further reduced by using the ceramic substrate as the support substrate layer 1.

In this embodiment, the sapphire substrate layer 4 is a planar sapphire substrate or a patterned sapphire substrate. The sapphire substrate layer 4 is bonded with the support substrate layer 1 through the first alumina layer 2, and the first alumina layer 2 is amorphous alumina. By introducing an amorphous alumina layer 2, on the one hand, a bonding force between the sapphire substrate layer 4 and the support substrate layer 1 may be increased, and on the other hand, a stress generated by lattice mismatch and thermal mismatch between the sapphire substrate layer 4 and the support substrate layer 1 may be released.

In one embodiment, the composite substrate provided in this embodiment may be annealed, an annealing temperature is less than 400° C., so that a bonding strength between the sapphire substrate layer 4 and the support substrate layer 1 may be improved to complete a permanent bonding.

In some embodiments, a total thickness of the sapphire substrate layer 4 and the first alumina layer 2 is greater than 1 μm. A thickness of the sapphire substrate layer 4 may be less than 500 nm.

Figure 2:
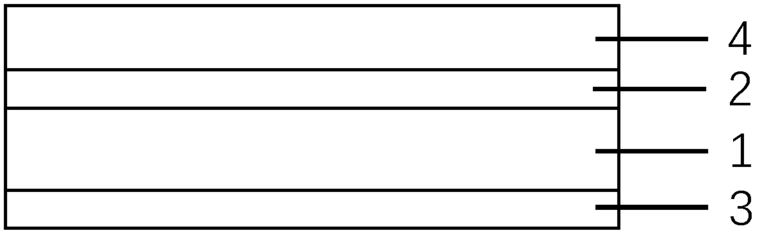
FIG. 2 is a structural schematic diagram of a composite substrate according to another embodiment of the present disclosure.

FIG. 2 is a structural schematic diagram of a composite substrate according to another embodiment of the present disclosure. The composite substrate in the embodiment of FIG. 2 is substantially the same as the composite substrate in the embodiment of FIG. 1, and a difference is that: as shown in FIG. 2, the composite substrate further includes a second alumina layer 3 disposed on a side, away from the first alumina layer 2, of the support substrate layer 1.

The second alumina layer 3 is also amorphous alumina, which plays a stress balancing role, may further reduce the stress, and is beneficial to the epitaxial growth of a gallium nitride-based material in subsequent. A thickness of the second alumina layer 3 may be the same as the thickness of the first alumina layer 2.

In this embodiment, the first alumina layer 2 and the second alumina layer 3 may be grown through a sputtering deposition method, and the uniformity of the alumina layer is less than ±2% (1σ), that is, when a mean thickness of the alumina layer is u, the probability of the thickness of the alumina layer from 0.98 u to 1.02 u is 0.682, the probability of the thickness from 0.96 u to 1.04 u is 0.954, and the probability of the thickness from 0.94 u to 1.06 u is 0.997, which conforms to the "3σ" principle of normal distribution.

Figure 3:
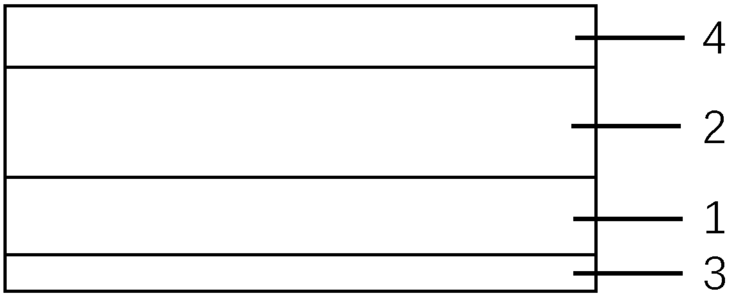
FIG. 3 is a structural schematic diagram of a composite substrate according to another embodiment of the present disclosure.

FIG. 3 is a structural schematic diagram of a composite substrate according to another embodiment of the present disclosure. The composite substrate in the embodiment of FIG. 3 is substantially the same as the composite substrate in the embodiment of FIG. 2, and a difference is that: as shown in FIG. 3, the thickness of the first alumina layer 2 and the thickness of the second alumina layer 3 are different.

In this embodiment, a total thickness of the sapphire substrate layer 4 and the first alumina layer 2 is greater than 1 μm. When the sapphire substrate is used in a power device, in order to improve a breakdown voltage of a material, a certain thickness of the sapphire substrate is required. A leakage of the device may be improved when the thickness of the sapphire substrate is greater than 1 μm. However, an increase in thickness may result in a proportional increase in a warping of the sapphire substrate. By increasing the thickness of the first alumina layer 2, the thickness of the sapphire substrate layer 4 may be reduced while ensuring that the total thickness of the sapphire substrate layer 4 and the first alumina layer 2 meets a requirement. The thickness of the sapphire substrate layer 4 may be less than 500 nm, thereby greatly reducing a stress of the sapphire substrate layer 4 while not reducing the breakdown voltage of the composite substrate. The thickness of the second alumina layer 3 is different from the thickness of the first alumina layer 2, which may balance a stress without reaching the thickness of the first alumina layer 2. Therefore, the thickness of the second alumina layer 3 may be reduced, so that an overall thickness of the composite substrate may be reduced, and an overall thickness of the subsequent epitaxial wafer and an overall thickness of the subsequent device may be reduced.

Figure 4:
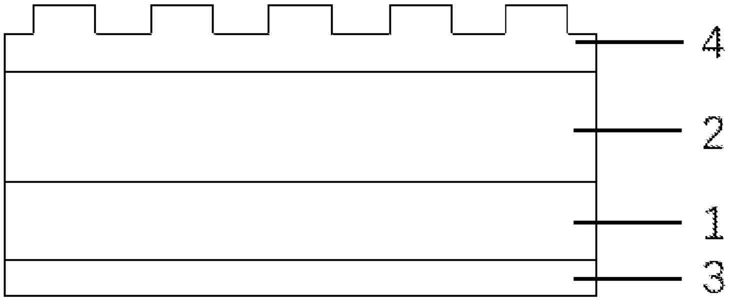
FIG. 4 is a structural schematic diagram of a composite substrate according to another embodiment of the present disclosure.

FIG. 4 is a structural schematic diagram of a composite substrate according to another embodiment of the present disclosure. The composite substrate in the embodiment of FIG. 4 is substantially the same as the composite substrate in the embodiment of FIG. 3, and a difference is that: as shown in FIG. 4, the sapphire substrate layer 4 is a patterned sapphire substrate. A contact surface between the patterned sapphire substrate and the first alumina layer 2 is a plane, and a side with a pattern is a subsequent epitaxial surface for growing an epitaxial layer.

Figure 5:
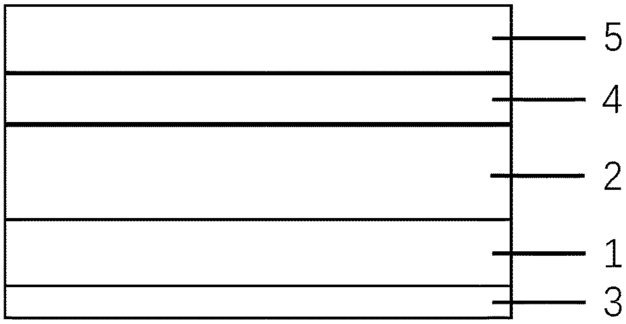
FIG. 5 is a structural schematic diagram of an epitaxial wafer according to an embodiment of the present disclosure.

FIG. 5 is a structural schematic diagram of an epitaxial wafer according to an embodiment of the present disclosure. As shown in FIG. 5, an epitaxial wafer is provided in this embodiment, and the epitaxial wafer includes the composite substrate provided by any one of the above-mentioned embodiments of the present disclosure and an epitaxial layer 5 grown on the sapphire substrate layer 4.

In one embodiment, the epitaxial layer is a gallium nitride layer. Gallium nitride is a wide band semiconductor material, which is suitable for a wide range of applications. In addition, gallium nitride also has good stability and its chemical property is stable at a high temperature. A Gallium nitride material has a high electron drift saturation velocity and electron mobility, and is particularly suitable for high-speed power devices. The Gallium nitride material also has characteristics of high electrical breakdown strength and low leakage current, and is particularly suitable for making high-voltage power devices.

During a growth process of a GaN epitaxial layer 5, the alumina grown on both sides of the support substrate layer 1 of the above-mentioned epitaxial layer may alleviate a tensile stress of the GaN epitaxial layer 5 grown on the sapphire substrate layer 4 by using the composite substrate provided by any of above-mentioned embodiments of the present disclosure, so that an internal stress and warping of the GaN epitaxial wafer may be reduced during epitaxial growth. Therefore, the epitaxial layer 5 has a high-quality, may effectively reduce a cost of the epitaxial wafer, and is compatible with existing large-scale processes.

Figure 6A:
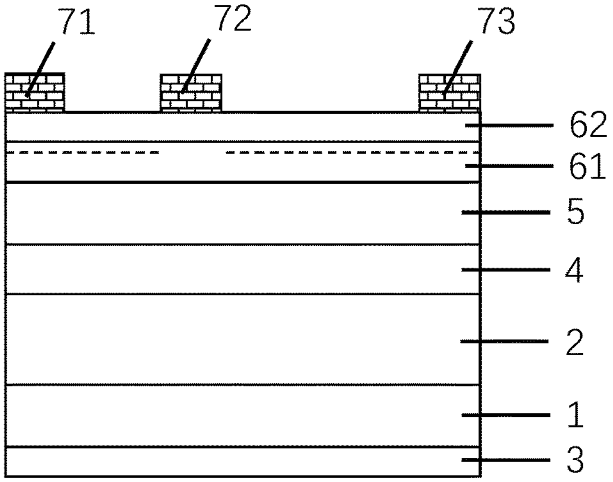
Figure 6B:
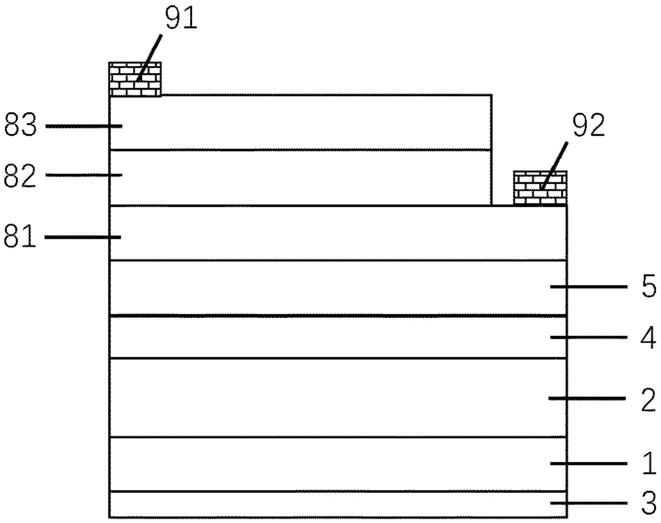

FIG. 6*a* is a structural schematic diagram of a semiconductor device according to an embodiment of the present disclosure. FIG. 6*b* is a structural schematic diagram of a semiconductor device according to another embodiment of the present disclosure. A semiconductor device is provided in an embodiment of the present disclosure, and the semiconductor device includes the epitaxial wafer provided by any one of the above-mentioned embodiments of the present disclosure and a device layer grown on the epitaxial wafer. The semiconductor device is any one of a High-Electron-Mobility Transistor (HEMT) device, a vertical power device, a radio frequency device and a Light-Emitting Diode (LED) device. Specifically, the semiconductor device may be a power device, such as HEMT, and the device layer includes a GaN channel layer/AlGaN barrier stack layer; or, the semiconductor device may be an LED device, and the device layer includes an N-type semiconductor layer, a multiple quantum well stack layer and a P-type semiconductor layer. Optionally, the multiple quantum well stack layer may be InGaN/GaN, for example, the multiple quantum well stack layer includes an InGaN layer and a GaN layer.

Specifically, when the semiconductor device is an HEMT (as shown in FIG. 6*a*), in addition to the epitaxial wafer provided in the present disclosure, the semiconductor device also includes a GaN channel layer 61, an AlGaN barrier layer 62 located on the above-mentioned epitaxial wafer, as well as a source 71, a drain 73 and a gate 72 located on the AlGaN barrier layer 62. When the semiconductor device is an LED (as shown in FIG. 6*b*), in addition to the epitaxial wafer provided in the present disclosure, the semiconductor device also includes an N-type semiconductor layer 81, a multiple quantum well stack layer 82, and a P-type semiconductor layer 83 located on the above-mentioned epitaxial wafer, as well as a cathode 92 located on the N-type semiconductor layer 81, and an anode 91 located on the P-type semiconductor layer 83.

The present disclosure provides a composite substrate, an epitaxial wafer and a semiconductor device, and the composite substrate includes a support substrate layer, a first alumina layer and a sapphire substrate layer that are stacked in sequence. The first alumina layer may increase a bonding force between the sapphire substrate layer and the support substrate layer and release a stress between the sapphire substrate layer and the support substrate layer. Meanwhile, the existence of the first alumina layer may improve a breakdown voltage of a material without increasing a thickness of the sapphire substrate layer. A second alumina layer disposed on a side, away from the first alumina layer, of the support substrate layer may play a role of stress balance.

During a growth process of a GaN epitaxial layer, the alumina disposed on both sides of the support substrate layer may also alleviate a tensile stress of the GaN epitaxial layer grown on the sapphire substrate layer, so that an internal stress and warping of the GaN epitaxial wafer may be reduced during epitaxial growth. Therefore, this composite substrate may reduce the impact caused by lattice mismatch and thermal mismatch between the GaN epitaxial layer and the sapphire substrate layer, and improve material quality and optical performance.

It should be understood that the term "including" and its variations used in the present disclosure are open-ended, that is, "including but not limited to". The term "one embodiment" means "at least one embodiment", the term "another embodiment" means "at least one other embodiment". In this specification, the schematic expressions of the above terms do not necessarily refer to the same embodiments or examples. Moreover, the described specific features, structures, materials, or characteristics may be combined in an appropriate manner in any one or more embodiments or examples. In addition, those of skill in the art may combine and permutation the different embodiments or examples described in this specification, as well as the features of different embodiments or examples, without contradiction.

The above-mentioned embodiments are only the preferred embodiments of the present disclosure, and not intended to limit the protection scope of the present disclosure. Any modification, equivalent replacement, improvement and so on that made in the spirit and principle of the present disclosure shall fall into the protection scope of the present disclosure.

What is claimed is:

1. A composite substrate, comprising:
- a support substrate layer;
- a first alumina layer disposed on the support substrate layer;
- a sapphire substrate layer disposed on the first alumina layer; and
- a second alumina layer disposed on a side, away from the first alumina layer, of the support substrate layer,
- wherein a thickness of the second alumina layer is less than a thickness of the first alumina layer.

2. The composite substrate according to claim 1, wherein the first alumina layer is amorphous alumina.

3. The composite substrate according to claim 1, wherein the first alumina layer and the second alumina layer are amorphous alumina.

4. The composite substrate according to claim 1, wherein the support substrate layer is a silicon substrate or a ceramic substrate.

5. The composite substrate according to claim 4, wherein the ceramic substrate is one of an aluminum nitride ceramic substrate, an alumina ceramic substrate, a silicon carbide ceramic substrate, a boron nitride ceramic substrate, a zirconia ceramic substrate, a magnesium oxide ceramic substrate, a silicon nitride ceramic substrate and a beryllium oxide ceramic substrate.

6. The composite substrate according to claim 1, wherein a total thickness of the sapphire substrate layer and the first alumina layer is greater than 1 μm.

7. The composite substrate according to claim 6, wherein a thickness of the sapphire substrate layer is less than 500 nm.

8. The composite substrate according to claim 1, wherein the sapphire substrate layer is a planar sapphire substrate or a patterned sapphire substrate.

9. The composite substrate according to claim 1, wherein a diameter of the support substrate layer is greater than or equal to 2 inches and less than or equal to 12 inches.

10. An epitaxial wafer, comprising:
- a composite substrate, wherein the composite substrate comprises a support substrate layer, a first alumina layer disposed on the support substrate layer, a sapphire substrate layer disposed on the first alumina layer, and a second alumina layer disposed on a side, away from the first alumina layer, of the support substrate layer, and a thickness of the second alumina layer is less than a thickness of the first alumina layer; and
- an epitaxial layer grown on the composite substrate, wherein the epitaxial layer comprises a gallium nitride layer.

11. A semiconductor device, comprising:

an epitaxial wafer, wherein the epitaxial wafer comprises a composite substrate, and the composite substrate comprises a support substrate layer, a first alumina layer disposed on the support substrate layer, a sapphire substrate layer disposed on the first alumina layer, and a second alumina layer disposed on a side, away from the first alumina layer, of the support substrate layer, and a thickness of the second alumina layer is less than a thickness of the first alumina layer; and a device layer grown on the epitaxial wafer.

12. The semiconductor device according to claim 11, wherein the semiconductor device is any one of a high-electron-mobility transistor device, a vertical power device, a radio frequency device and a light-emitting diode device.

13. The semiconductor device according to claim 11, wherein the semiconductor device is a power device, and the device layer comprises a GaN channel layer and an AlGaN barrier stack layer.

14. The semiconductor device according to claim 11, wherein the semiconductor device is a light-emitting diode (LED) device, and the device layer comprises an N-type semiconductor layer, a multiple quantum well stack layer, and a P-type semiconductor layer.

15. The semiconductor device according to claim 14, wherein the multiple quantum well stack layer comprises an InGaN layer and a GaN layer.

* * * * *